(12) United States Patent
Bouza, II et al.

(10) Patent No.: US 12,006,075 B2
(45) Date of Patent: Jun. 11, 2024

(54) HEATSINK ASSEMBLY FOR UNMANNED AERIAL VEHICLE

(71) Applicant: PARRY LABS LLC, Arlington, VA (US)

(72) Inventors: Jose' M. Bouza, II, Louisa, VA (US); Michael R. Walters, Baltimore, MD (US)

(73) Assignee: PARRY LABS LLC, Arlington, VA (US)

( * ) Notice: Subject to any disclaimer, the term of this patent is extended or adjusted under 35 U.S.C. 154(b) by 284 days.

(21) Appl. No.: 17/678,786

(22) Filed: Feb. 23, 2022

(65) Prior Publication Data

US 2023/0269911 A1 Aug. 24, 2023

(51) Int. Cl.
*H05K 7/20* (2006.01)
*B64U 20/92* (2023.01)
*B64U 20/98* (2023.01)

(52) U.S. Cl.
CPC ............. *B64U 20/98* (2023.01); *B64U 20/92* (2023.01); *H05K 7/20336* (2013.01)

(58) Field of Classification Search
CPC ....... B64C 39/024; B64U 10/00; G06F 1/206; G06F 1/203; G06F 1/1613; G06F 1/20; H05K 7/2039; H05K 7/2029; H05K 7/20336; H05K 7/20418; H05K 7/20436; H05K 7/20509; H05K 7/20845; H05K 7/20854; H05K 7/20881; H05K 2201/06; F28D 15/02; H01L 23/36; H01L 23/373; H01L 23/3736; H01L 23/4006; H01L 23/42; H01L 23/427; H01L 2023/4037
See application file for complete search history.

(56) References Cited

U.S. PATENT DOCUMENTS

| | | | | |
|---|---|---|---|---|
| 5,331,510 | A * | 7/1994 | Ouchi ................ | F28D 15/0275 174/15.2 |
| 11,085,703 | B2 * | 8/2021 | Watanabe ........... | F28D 15/0233 |
| 2022/0042747 | A1 * | 2/2022 | Bishop ................ | B64D 13/006 |

* cited by examiner

*Primary Examiner* — Zachary Pape
*Assistant Examiner* — Steven Ngo
(74) *Attorney, Agent, or Firm* — Von Rohrscheidt Patents

(57) ABSTRACT

A UAV heatsink assembly including two heat pipes, a first and second heat pipes including transfer and end portions, the end portions thermally connected to first and second metallic heat transfer elements, and a third metallic heat transfer element thermally connected to opposite ends of the heat pipes. A CPU thermally connected to the third metallic heat transfer element with first and second electrically insulating thermoplastic elements into which the respective first and second metallic components fit where the first and second electrically insulating thermoplastic elements are not between an outside ambient environment and the first and second metallic components. The heat pipes each include a wick structure and an embedded liquid providing thermal transport therein while at least some of the embedded liquids are above a threshold temperature between −40° C. and 70° C. such that the UAV is at least operable above −40° C. degrees and below 70° C.

8 Claims, 7 Drawing Sheets

HEATSINK ASSEMBLY FOR UNMANNED AERIAL VEHICLE

FIELD OF THE INVENTION

The present invention relates generally to a heatsink assembly, and more particularly, to a heatsink assembly for an unmanned aerial vehicle.

BACKGROUND

The United States military often desires their equipment be able to operate in extreme heat as well as extreme cold and typically include these operating temperature ranges when procuring equipment. Not surprisingly, the United States military typically desires unmanned aerial vehicles to operate extreme heat as well as extreme cold. Unfortunately, heatsink assemblies for many unmanned aerial vehicles are only able to accommodate either the extreme heat or the extreme cold but not both and the United States military ends up waving or reducing the operating temperature range. Accordingly, there is a strong need in the art to improve the operating temperature ranges of unmanned aerial vehicles.

SUMMARY OF THE INVENTION

An aspect of the present invention is to provide a heatsink assembly for an unmanned aerial vehicle including a first heat pipe including a first transfer portion between a first end portion and a second end portion, a second heat pipe including a second transfer portion between a third end portion and a fourth end portion, a first metallic heat transfer element thermally connected to the first end portion, a second metallic heat transfer element thermally connected to the third end portion, a third metallic heat transfer element thermally connected to the second end portion and the fourth end portion, a computer processing unit that produces heat that is thermally connected to the third metallic heat transfer element, a first electrically insulating thermoplastic element into which the first metallic component fits such that a surface area of the first metallic component is thermally connected to an outside ambient environment where the first electrically insulating thermoplastic element is not between the outside ambient environment and first metallic component, and a second electrically insulating thermoplastic element into which the second metallic component fits such that a surface area of the second metallic component is thermally connected to an outside ambient environment where the second electrically insulating thermoplastic element is not between the outside ambient environment and the second metallic component. The first heat pipe includes a first wick structure and a first embedded liquid providing thermal transport within the first heat pipe while at least some of the first embedded liquid is above a threshold temperature. The second heat pipe includes a second wick structure and a second embedded liquid providing thermal transport within the second heat pipe while at least some of the second embedded liquid is above the threshold temperature. The unmanned aerial vehicle is at least operable at temperatures above −40° C. degrees and is at least operable at temperatures below 70° C., and the threshold temperature is between −40° C. and 70° C. A third electrically insulating thermoplastic element may be included and the third metallic heat transfer element may include an extension piece. The computer processing unit may be between the extension piece of the third metallic heat transfer element and the third electrically insulating thermoplastic element, and the third electrically insulating thermoplastic element electrically may insulate the computer processing unit from the third metallic heat transfer element. A fourth metallic heat transfer element may be adjacent to the third electrically insulating thermoplastic element such that the third electrically insulating thermoplastic element is between the fourth metallic heat transfer element and the computer processing unit. The first metallic heat transfer element may include aluminum. The second metallic heat transfer element may include aluminum. The third metallic heat transfer element may include aluminum. The fourth metallic heat transfer element may include aluminum. The fourth metallic heat transfer element may include a relay electrically connected to the computer processing unit, and the relay may be electrically isolated from the aluminum of the fourth metallic heat transfer element.

BRIEF DESCRIPTION OF THE DRAWINGS

The invention will be described in detail with reference to the following drawings in which like reference numerals refer to like elements wherein.

DETAILED DESCRIPTION

Figure 1:
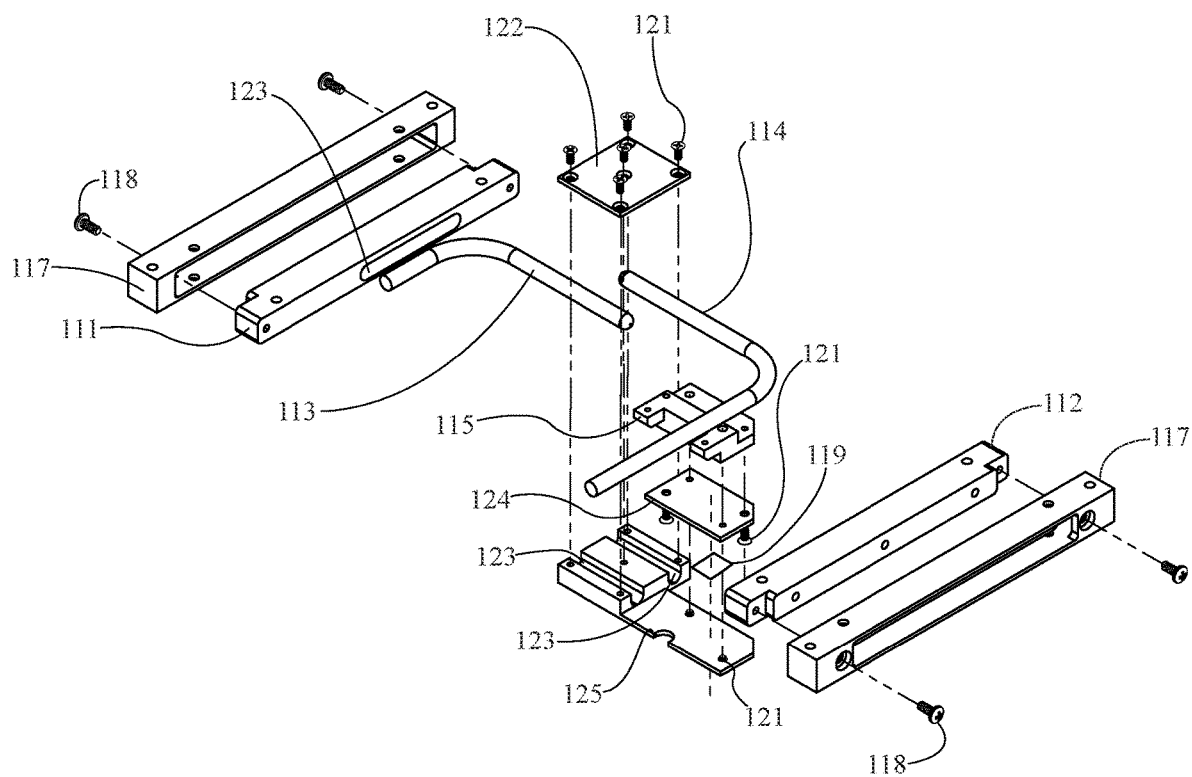
FIG. 1 illustrates an exploded view of an exemplary embodiment a heatsink assembly of the present invention.

Being able to operate unmanned aerial vehicles in both extreme heat as well as extreme cold has proven problematic to achieve. A focus to achieve this desired temperature operating range has been the heatsink assembly. Heatsink assemblies are typically made from high thermal conductive materials such as aluminum and copper but these conventional heatsink assemblies have proven unable to make unmanned aerial vehicles operatable in both extreme heat as well as extreme cold. However, it has been discovered that a few well-placed electrically insulating thermoplastic components expands rather than reduces the temperature operating range and additionally provides electrical insulating components on opposite sides of the electrically insulated thermoplastic components.

A heatsink assembly for an unmanned aerial vehicle or similar vehicle including a first heat pipe with a first transfer portion that transfers thermal energy between a first end portion and a second end portion, a second heat pipe including a second transfer portion that transfers thermal energy between a third end portion and a fourth end portion, a first metallic heat transfer element thermally connected to the first end portion, a second metallic heat transfer element thermally connected to the third end portion, a third metallic heat transfer element thermally connected to the second end portion and the fourth end portion, a computer processing unit that produces heat that is thermally connected to the third metallic heat transfer element, a first electrically insulating thermoplastic element into which the first metallic component fits such that a surface area of the first metallic component is thermally connected to an outside ambient environment (e.g., chassis wall) where the first electrically insulating thermoplastic element is not between the outside ambient environment and first metallic component, and a second electrically insulating thermoplastic element into which the second metallic component fits such that a surface area of the second metallic component is thermally connected to an outside ambient environment where the second electrically insulating thermoplastic element is not between the outside ambient environment and second metallic component. The first heat pipe includes a first wick structure and a first embedded liquid providing thermal transport within the first heat pipe while at least some of the first embedded liquid is above a threshold temperature, and the second heat pipe includes a second wick structure and a second embedded liquid providing thermal transport within the second heat pipe while at least some of the second embedded liquid is above the threshold temperature. The wick structures of the first and second heat pipes are better at transferring heat than a pure metal structure because the respectively embedded liquids evaporate due to the heat from the computer processing unit and then condense back to a liquid when the heat is transferred to the outside ambient environment. However, when the temperature of the first and second heat pipes is at or below the threshold temperature the respective embedded liquids evaporation amount is reduced and for even colder temperatures is eliminated. Since the amount of evaporation is reduced or eliminated, the amount of heat transferred to the outside ambient environment from the computer processing unit is reduced thereby increasing the internal temperature and making the unmanned aerial vehicle functional over a larger temperature range. The operational temperature range may be further enhanced by including a third electrically insulating thermoplastic element that is essentially parallel to an extension piece of the third metallic heat transfer element such that the computer processing unit is between the extension piece of the third metallic heat transfer element and the third electrically insulating thermoplastic element. The third electrically insulating thermoplastic element electrically insulates the computer processing unit from the third metallic heat transfer element. Additionally, the third electrically insulating thermoplastic element restricts the flow of thermal energy through itself as compared to the flow of thermal energy that is exhausted via the first and second heat pipes by the evaporation and condensation cycle. Thus, an even larger share of the heat produced by the computer processing unit is exhausted by the first and second heat pipes than would occur if the third electrically insulating thermoplastic element were to be omitted while the evaporation and condensation cycle is working. However, when the evaporation and condensation cycle starts to break down because the threshold temperature of the embedded liquid is reached, an increased portion of the thermal energy is transported through the third electrically insulating thermoplastic element which helps keep the internal temperature higher in colder environments.

Many different electrically insulating thermoplastics may be used in the various embodiments of the present invention. Exemplary electrically insulating thermoplastics are discussed below.

Acrylonitrile butadiene styrene (ABS or ABS plastic) is a well-known thermoplastic polymer having the chemical formula $(C_8H_8)_x\cdot(C_4H_6)_y\cdot(C_3H_3N)_z$. ABS is a terpolymer made by, for example, polymerizing styrene and acrylonitrile in the presence of polybutadiene. The proportions can vary from 15% to 35% of acrylonitrile, 5% to 30% of butadiene and 40% to 60% of styrene. Additives may also be included during the manufacture of ABS plastics. ABS plastics typically have a thermal conductivity about 1.35 W/m-K.

Polyvinyl chloride (PVC or PVC plastic) is a well-known thermoplastic polymer having the chemical formula $C_2H_3Cl$. PVC may be made by suspension polymerization, emulsion polymerization, and bulk polymerization processes. A related material is chlorinated polyvinyl chloride (CPVC or CPVC plastic) which is polyvinyl chloride that has been chlorinated via a free radical chlorination reaction. Additives may also be included during the manufacture of the PVC and CPVC plastics. PVC plastics typically have a thermal conductivity about 1.1 W/m-K and CPVC plastics typically have a thermal conductivity about 1.0 W/m-K.

Polyethylene (PE or PE plastic) is a well-known thermoplastic polymer. Many kinds of polyethylene are known, with most having the chemical formula $(C_2H_4)_n$, and they are made by various well known processes. PE is usually a mixture of similar polymers of ethylene, with various values of n. Crosslinked polyethylene (PEX or PEX plastic) is a variant of PE plastics that is crosslinked. Additives may also be included during the manufacture of the PE and PEX plastics. PE and PEX plastics typically have a thermal conductivity about 3.2 W/m-K.

Polybutylene (PB or PB plastic) is a well-known thermoplastic polymer having the chemical formula $CH_2CH(CH_2CH_3)$. Polybutylene is produced by polymerization of 1-butene using supported Ziegler—Natta catalysts. Additives may also be included during the manufacture of the PB plastics. PB plastics typically have a thermal conductivity about 1.5 W/m-K.

Polyvinylidene fluoride or polyvinylidene difluoride (PVDF or PVDF plastic) is a well-known thermoplastic produced by the polymerization of vinylidene difluoride. PVDF may be synthesized from the gaseous vinylidene fluoride monomer by a free-radical (or controlled-radical) polymerization process. Additives may also be included during the manufacture of the PVDF plastic. PVDF plastics typically have a thermal conductivity about 1.5 W/m-K.

The electrically insulating thermoplastics discussed above, as well as other suitable electrically insulating thermoplastics, may be used to fabricate the insulator and electrically insulating thermoplastic sleeves 117 and a second plate (connector/heat sink) 124. Electrically insulating thermoplastics are used because they have desirable properties to implement UAVs operable in both extremely hot and cold environments, and because they also provide other advantages. For example, ABS plastics have a wide range of applications based upon their favorable mechanical properties such as impact resistance, toughness, and rigidity when compared with other common polymers. However, electrically insulating thermoplastics being used as part of a heat sink in an unmanned aerial vehicle is not suggested by any of these properties. Rather, heat sinks typically use high thermal conductivity materials such as copper and aluminum in the construction of heat sinks. The thermal conductivity of aluminum alloy 6061-T6, for example, is about 167 W/m-K while electrically insulating thermoplastics have a much lower thermal conductivity. Electrically insulating thermoplastics may be selected from those having a thermal conductivity less than or equal to 8 W/m-K, or more advantageously a thermal conductivity less than or equal to 4 W/m-K.

FIG. 1 illustrates an exploded view of an exemplary embodiment a heatsink assembly 100 of the present invention including a first mounting block/thermal transfer combination 111, a second mounting block/thermal transfer combination 112, a first heat pipe 113, a second heat pipe 114, a heat spreader and solid-state drive relay 115, an electrically insulating thermoplastic sleeve 117, screws 118, a computer processing unit 119, screws 121, a first plate 122, and a thermally conductive epoxy 123, a second plate (connector/heat sink) 124, and a fixation piece 125.

The first mounting block/thermal transfer combination 111 may be made from any suitable highly thermally conducting material such as aluminum alloy 6061-T6. Optionally, additional elements may be installed into the highly thermally conducting material by removing some of the highly thermally conducting material and installing the additional elements.

The second mounting block/thermal transfer combination 112 may be made from any suitable highly thermally conducting material such as aluminum alloy 6061-T6. Optionally, additional elements may be installed into the highly thermally conducting material by removing some of the highly thermally conducting material and installing the additional elements.

The first heat pipe 113 may be made from a closed evaporator-condenser heat transfer system. The first heat pipe 113 has a wick structure and an embedded liquid that provides excellent heat flux transport capability, typically 10 plus times greater than solid copper pipe of the same dimensions. An exemplary first heat pipes 113 is one such as the 5 mm diameter by 100 mm long heat pipe from Advanced Thermal Solutions, Inc. which has an operating temperature of about 30° C. to 120° C. Thus, the threshold temperature for the heatsink assembly is about 30° C. Any alternative providing the same function or better may also be used.

The second heat pipe 114 may be made from a closed evaporator-condenser heat transfer system. The second heat pipe 114 has a wick structure and an embedded liquid that provides excellent heat flux transport capability, typically 10 plus times greater than solid copper pipe of the same dimensions. An exemplary second heat pipes 114 is one such as the 5 mm diameter by 150 mm long heat pipe from Advanced Thermal Solutions, Inc. which has an operating temperature of about 30° C. to 120° C. Thus, the threshold temperature for the heatsink assembly is about 30° C. Any alternative providing the same function or better may also be used.

The heat spreader and solid-state drive relay 115 may be formed from a high thermal transfer material a such as aluminum alloy 6061-T6 and any suitable standard or custom solid-state drive relays. Optionally, additional elements may be installed into the highly thermally conducting material by removing some of the highly thermally conducting material and installing the additional elements. The solid-state drive may be mSAT, M.2, or any other suitable solid-state drive.

The insulator and electrically insulating thermoplastic sleeve 117 may be formed from any suitable electrically insulating thermoplastic such as ABS plastic.

The screws 118, 121 may be any suitable type of screws such as 1 18-8 stainless steel screws.

The connector, heat sink 124 may be made from any suitable electrically insulating thermoplastic such as ABS plastic.

The heat spreader and solid-state drive relay 115 may be made from aluminum alloy 6061-T6. The solid-state drive may be mSAT, M.2, any other suitable solid-state drive.

The first plate 122 may be made from any suitable highly thermally conducting material such as aluminum alloy 6061-T6.

The thermally conductive epoxy 123 may be selected from any suitable thermally conductive epoxy. An exemplary epoxy is available from Wakefield-Vette, Inc. which may be cured at 140° F. for 15 minutes. Higher temperature curing materials should be avoided because the higher temperatures may damage the first and second heat pipes 113, 114. Alternatively, non-epoxy materials may be used provided they provide suitable thermal conductivity.

The exemplary embodiment a heatsink assembly 100 has an operating temperature range of −40° C. to 70° C.

Figure 2:
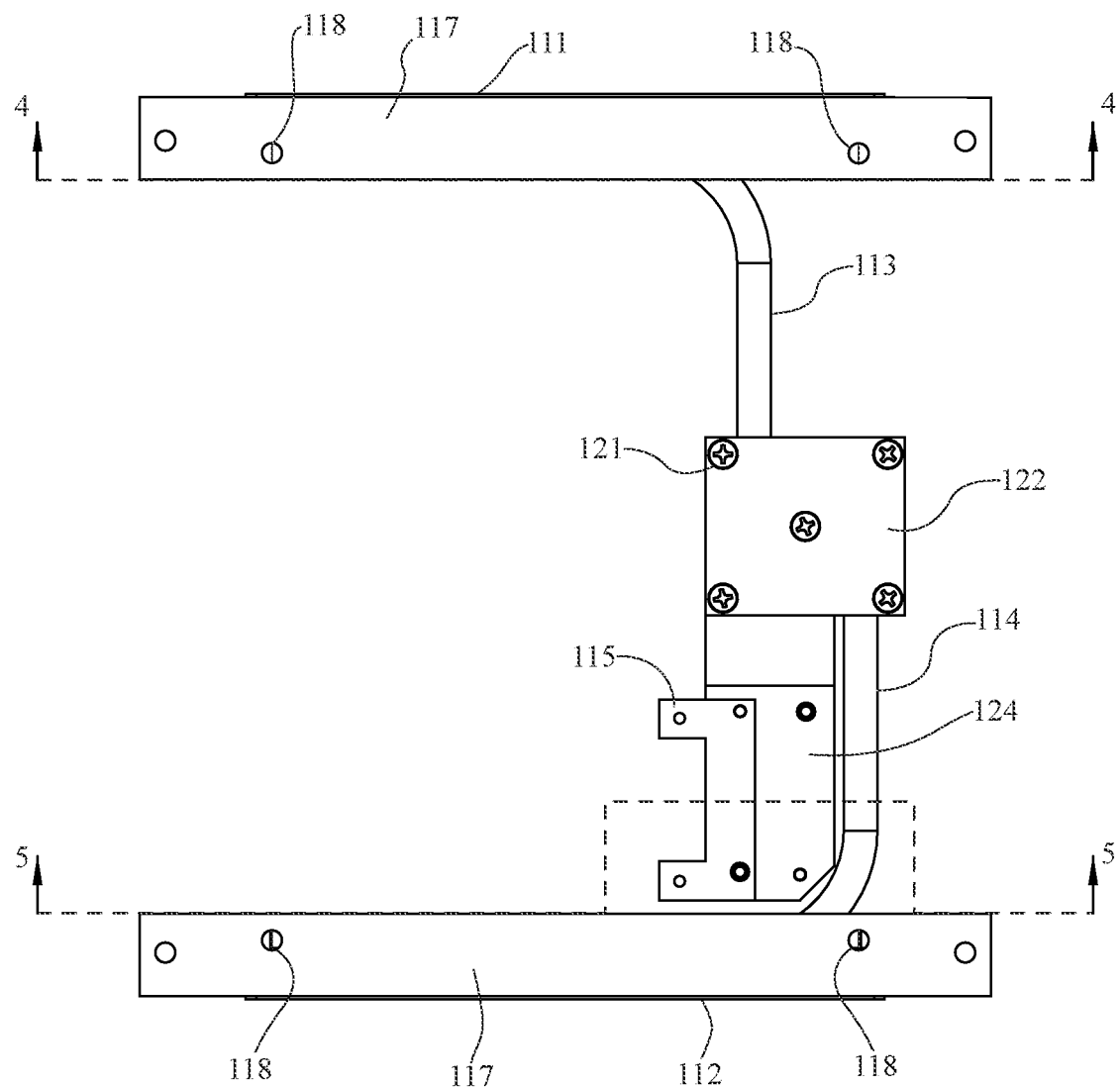
FIG. 2 is an assembled top view of the heatsink of FIG. 1.

FIG. 2 is an assembled top view of the heatsink of FIG. 1.

Figure 3:
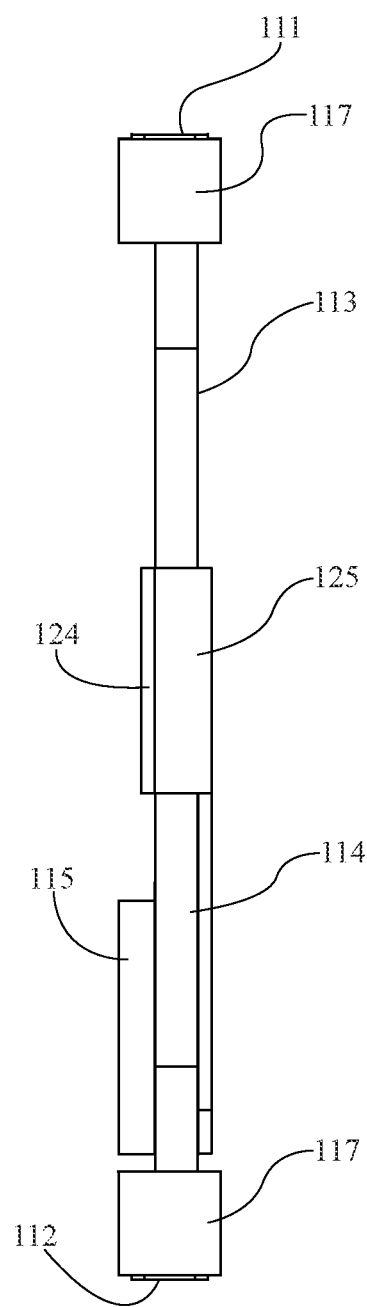
FIG. 3 is an assembled side view of the heatsink of FIG. 1.

FIG. 3 is an assembled side view of the heatsink of FIG. 1.

Figure 4:
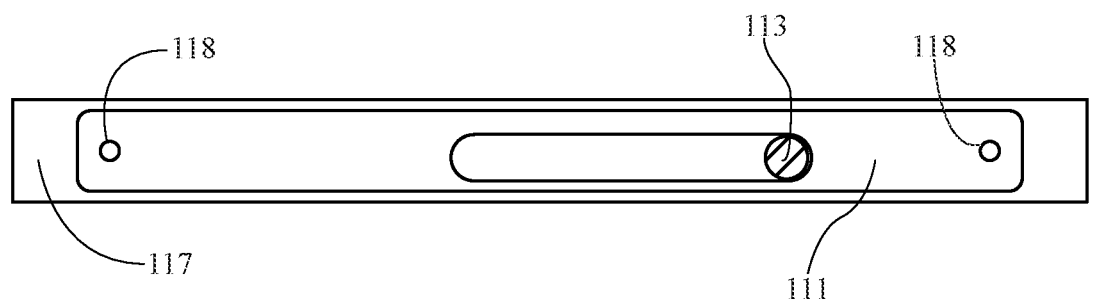
FIG. 4 is a cross section of part of the heatsink of FIG. 1.

FIG. 4 is a cross section of part of the heatsink of FIG. 1.

Figure 5:
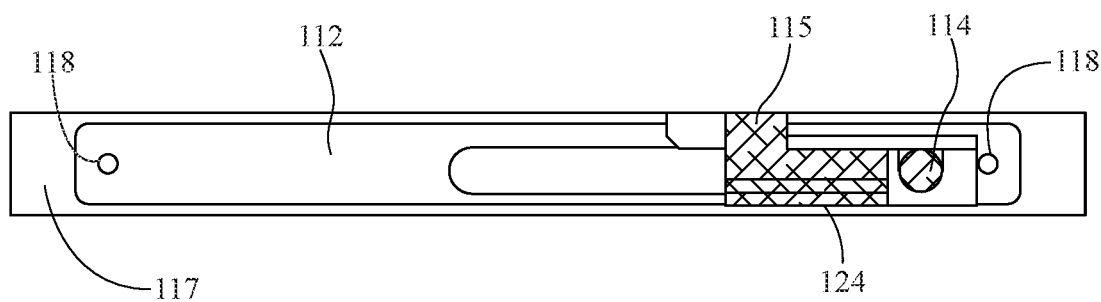
FIG. 5 is another cross section of part of the heatsink of FIG. 1.

FIG. 5 is another cross section of part of the heatsink of FIG. 1.

Figure 6:
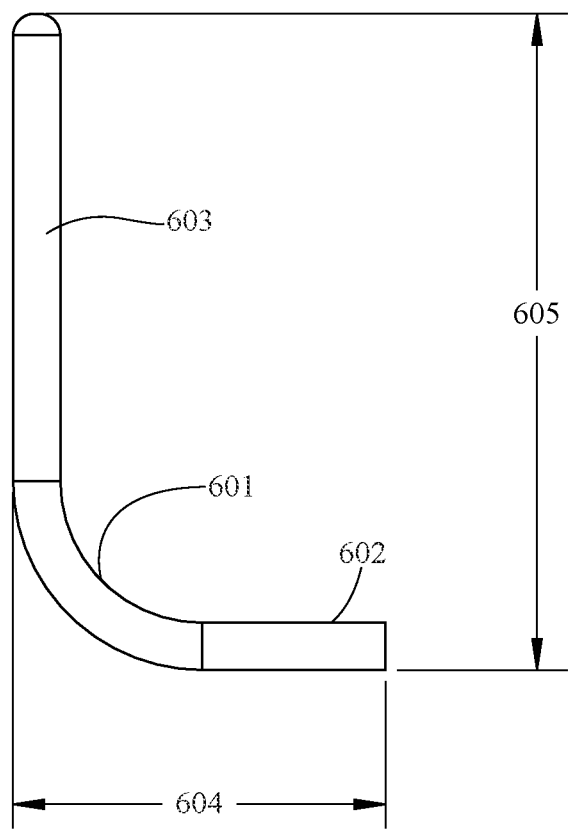
FIG. 6 is an illustration of an exemplary first heat pipe.

FIG. 6 is an illustration of an exemplary first heat pipe 113. The first heat pipe 113 includes a curved portion 601 having a radius of curvature, a first end portion 602 which is to be placed into the first mounting block/thermal transfer combination 111 and fixed there with the thermally conductive epoxy 123, and a second end portion 603 which is fixed between the first plate 122 and the fixation piece 125 by screws 121. This exemplary first heat pipe 113 has a width 604 of 1.55 in., a length 605 of 2.73 in., and curved a radius of curvature of 0.59 in. Alternatively, any suitable width 604, length 605 or radius of curvature may be used.

Figure 7:
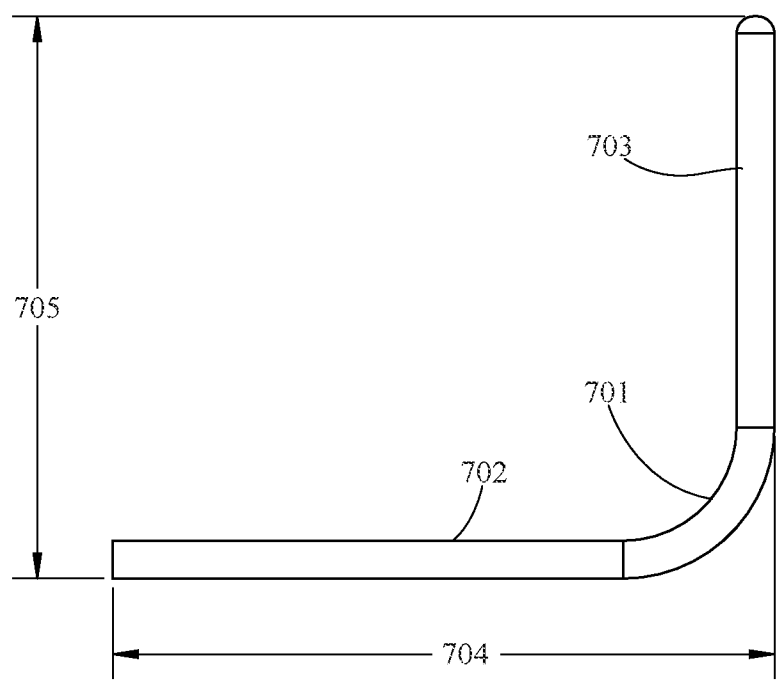
FIG. 7 is an illustration of an exemplary second heat pipe.

FIG. 7 is an illustration of an exemplary second heat pipe 114. The second heat pipe 114 includes a curved portion 701 having a radius of curvature, a first end portion 702 which is to be placed into the second mounting block/thermal transfer combination 112 and fixed there with the thermally conductive epoxy 123, and a second end portion 703 which is fixed between the first plate 122 and the fixation piece 125 by screws 121. This exemplary second heat pipe 114 has a width 604 of 3.44 in., a length 605 of 2.93 in., and curved a radius of curvature of 0.59 in. Alternatively, any suitable width 604, length 605 or radius of curvature may be used.

The second plate (connector/heat sink) 124 may be made from any suitable electrically insulating thermoplastic such as ABS plastic.

The fixation piece 125 may be made from any suitable highly thermally conducting material such as aluminum alloy 6061-T6. Optionally, additional elements may be installed into the highly thermally conducting material by removing some of the highly thermally conducting material and installing the additional elements.

The use of heat pipes improves thermal transfer efficiency compared to conventional copper or aluminum configurations, are passive which conserves power, lack moving parts which improves mechanical reliability, and allows for use in totally sealed equipment.

Although several embodiments of the present invention and its advantages have been described in detail, it should be understood that changes, substitutions, transformations, modifications, variations, permutations, and alterations may be made therein without departing from the teachings of the present invention, the spirit and the scope of the invention being set forth by the appended claims.

REFERENCE NUMERALS AND DESIGNATIONS 100 heatsink assembly
111 first mounting block/thermal transfer combination
112 second mounting block/thermal transfer combination 113 first heat pipe
114 second heat pipe
115 heat spreader and solid-state drive relay
117 an insulator and electrically insulating thermoplastic sleeve
118 screws
119 a computer processing unit
121 screws
122 first plate
123 a thermally conductive epoxy
124 second plate (connector/heat sink)
125 fixation piece
601 curved portion
602 first end portion
603 second end portion
604 width
605 length
701 curved portion
702 first end portion
703 second end portion
704 width
705 length

What is claimed is:

1. A heatsink assembly for an unmanned aerial vehicle comprising:
   a first heat pipe including a first transfer portion between a first end portion and a second end portion;
   a second heat pipe including a second transfer portion between a third end portion and a fourth end portion;
   a first metallic heat transfer element thermally connected to the first end portion;
   a second metallic heat transfer element thermally connected to the third end portion;
   a third metallic heat transfer element thermally connected to the second end portion and the fourth end portion;
   a computer processing unit that produces heat that is thermally connected to the third metallic heat transfer element;
   a first electrically insulating thermoplastic element into which the first metallic heat transfer element fits such that a surface area of the first metallic heat transfer element is thermally connected to an outside ambient environment where the first electrically insulating thermoplastic element is not between the outside ambient environment and the first metallic heat transfer element; and a second electrically insulating thermoplastic element into which the second metallic heat transfer element fits such that a surface area of the second metallic heat transfer element is thermally connected to the outside ambient environment where the second electrically insulating thermoplastic element is not between the outside ambient environment and the second metallic heat transfer element,
   wherein the first heat pipe includes a first wick structure and a first embedded liquid providing thermal transport within the first heat pipe while at least some of the first embedded liquid is above a threshold temperature,
   wherein the second heat pipe includes a second wick structure and a second embedded liquid providing thermal transport within the second heat pipe while at least some of the second embedded liquid is above the threshold temperature,
   wherein the unmanned aerial vehicle is at least operable at temperatures above −40° C. degrees and is at least operable at temperatures below 70° C., and
   wherein the threshold temperature is between −40° C. and 70° C.

2. The heatsink assembly of claim 1, further comprising:
   a third electrically insulating thermoplastic element,
   wherein the third metallic heat transfer element includes an extension piece,
   wherein the computer processing unit is between the extension piece of the third metallic heat transfer element and the third electrically insulating thermoplastic element, and
   wherein the third electrically insulating thermoplastic element electrically insulates the computer processing unit from a fourth metallic heat transfer element.

3. The heatsink assembly of claim 1, further comprising:
   a fourth metallic heat transfer element adjacent to a third electrically insulating thermoplastic element such that the third electrically insulating thermoplastic element is between the fourth metallic heat transfer element and the computer processing unit.

4. The heatsink assembly of claim 1, wherein the first metallic heat transfer element includes aluminum.

5. The heatsink assembly of claim 1, wherein the second metallic heat transfer element includes aluminum.

6. The heatsink assembly of claim 1, wherein the third metallic heat transfer element includes aluminum.

7. The heatsink assembly of claim 1, wherein a fourth metallic heat transfer element includes aluminum.

8. The heatsink assembly of claim 7,
   wherein the fourth metallic heat transfer element includes a relay electrically connected to the computer processing unit, and
   wherein the relay is electrically isolated from the aluminum of the fourth metallic heat transfer element.

* * * * *